（12) United States Patent
Kato

(10) Patent No.: US 9,064,586 B2
(45) Date of Patent: Jun. 23, 2015

(54) NON-VOLATILE SEMICONDUCTOR STORAGE DEVICE HAVING CONTROLLER CONFIGURED TO PERFORM PRELIMINARY ERASE OPERATION

(71) Applicant: Koji Kato, Kanagawa (JP)

(72) Inventor: Koji Kato, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/728,263

(22) Filed: Dec. 27, 2012

(65) Prior Publication Data

US 2013/0163338 A1 Jun. 27, 2013

(30) Foreign Application Priority Data

Dec. 27, 2011 (JP) ................................. 2011-285669

(51) Int. Cl.
| | |
|---|---|
| *G11C 16/16* | (2006.01) |
| *G11C 16/02* | (2006.01) |
| *G11C 16/04* | (2006.01) |

(52) U.S. Cl.
CPC ............... *G11C 16/16* (2013.01); *G11C 16/04* (2013.01); *G11C 16/02* (2013.01); *G11C 16/0483* (2013.01)

(58) Field of Classification Search
CPC  H01L 29/792; H01L 21/28282; G11C 16/16; G11C 11/5635; G11C 16/02; G11C 16/0483; G11C 16/04
USPC ............................ 365/185.12, 185.22, 185.29
See application file for complete search history.

(56) References Cited

U.S. PATENT DOCUMENTS

| | | | |
|---|---|---|---|
| 6,614,693 B1* | 9/2003 | Lee et al. | ................. 365/185.29 |
| 7,995,392 B2 | 8/2011 | Shibata | |
| 8,149,631 B2 | 4/2012 | Shiino et al. | |
| 2009/0290427 A1* | 11/2009 | Park | ........................ 365/185.22 |
| 2010/0080063 A1 | 4/2010 | Nakagawa | |
| 2011/0069551 A1* | 3/2011 | Kim | ........................ 365/185.12 |
| 2012/0026778 A1 | 2/2012 | Maejima | |

FOREIGN PATENT DOCUMENTS

| | | |
|---|---|---|
| JP | 2005-32368 A | 2/2005 |
| JP | 2005-276428 | 10/2005 |
| JP | 2009-163782 | 7/2009 |
| JP | 2010-80007 | 4/2010 |
| JP | 2011-40142 | 2/2011 |

OTHER PUBLICATIONS

Office Action issued Jul. 29, 2014, in Japanese Patent Application No. 2011-285669 with English translation.

* cited by examiner

*Primary Examiner* — Richard Elms
*Assistant Examiner* — Ajay Ojha
(74) *Attorney, Agent, or Firm* — Oblon, McClelland, Maier & Neustadt, L.L.P.

(57) ABSTRACT

A non-volatile semiconductor storage device includes a memory cell array where memory cells are arranged in a matrix shape; and a control unit which erases the memory cell by applying an erasing voltage to a well side of the memory cell and preliminarily erases the memory cell by applying a preliminary erasing voltage to the well side of the memory cell before the erasing while applying a voltage, which is higher than the voltage during the erasing, to a control gate electrode of the memory cell.

18 Claims, 6 Drawing Sheets

United States Patent US 9,064,586 B2

NON-VOLATILE SEMICONDUCTOR STORAGE DEVICE HAVING CONTROLLER CONFIGURED TO PERFORM PRELIMINARY ERASE OPERATION

CROSS-REFERENCE TO RELATED APPLICATIONS

This application is based upon and claims the benefit of priority from Japanese Patent Application No. 2011-285669, filed on Dec. 27, 2011; the entire contents of which are incorporated herein by reference.

FIELD

The embodiment generally relates to a non-volatile semiconductor storage device.

BACKGROUND

A memory cell of a non-volatile semiconductor storage device has a function of electrical rewriting by charge exchanges between a charge storage layer such as an insulating film having charge traps or a floating gate and a semiconductor substrate. In the memory cell, at the data writing or erasing time, since a high electric field is applied to a tunnel insulating film between the charge storage layer and the substrate to perform the change exchange, large stress is exerted on the tunnel insulating film when the writing or erasing is executed. If the writing or erasing is repetitively executed, the tunnel oxide film is deteriorated, and thus, a large number of the electron traps exist. Therefore, the control of a threshold value of the memory cell is deteriorated due to the high electric field applied at the writing or erasing time. Furthermore, the lifetime of the memory cell is shortened.

DETAILED DESCRIPTION

In general, according to one embodiment, a non-volatile semiconductor storage device includes a memory cell array, an erasing control unit, and a preliminary erasing control unit. In the memory cell array, memory cells are arranged in a matrix shape. The erasing control unit erases the memory cell by applying an erasing voltage to a well side of the memory cell. The preliminary erasing control unit preliminarily erases the memory cell by applying a voltage higher than that of the erasing period to a control gate electrode of the memory cell and by applying a preliminary erasing voltage to the well side of the memory cell before the erasing.

Hereinafter, the non-volatile semiconductor storage device according to the embodiments will be described with reference to the drawings. In addition, the present invention is not limited to the embodiments.

First Embodiment

Figure 1:
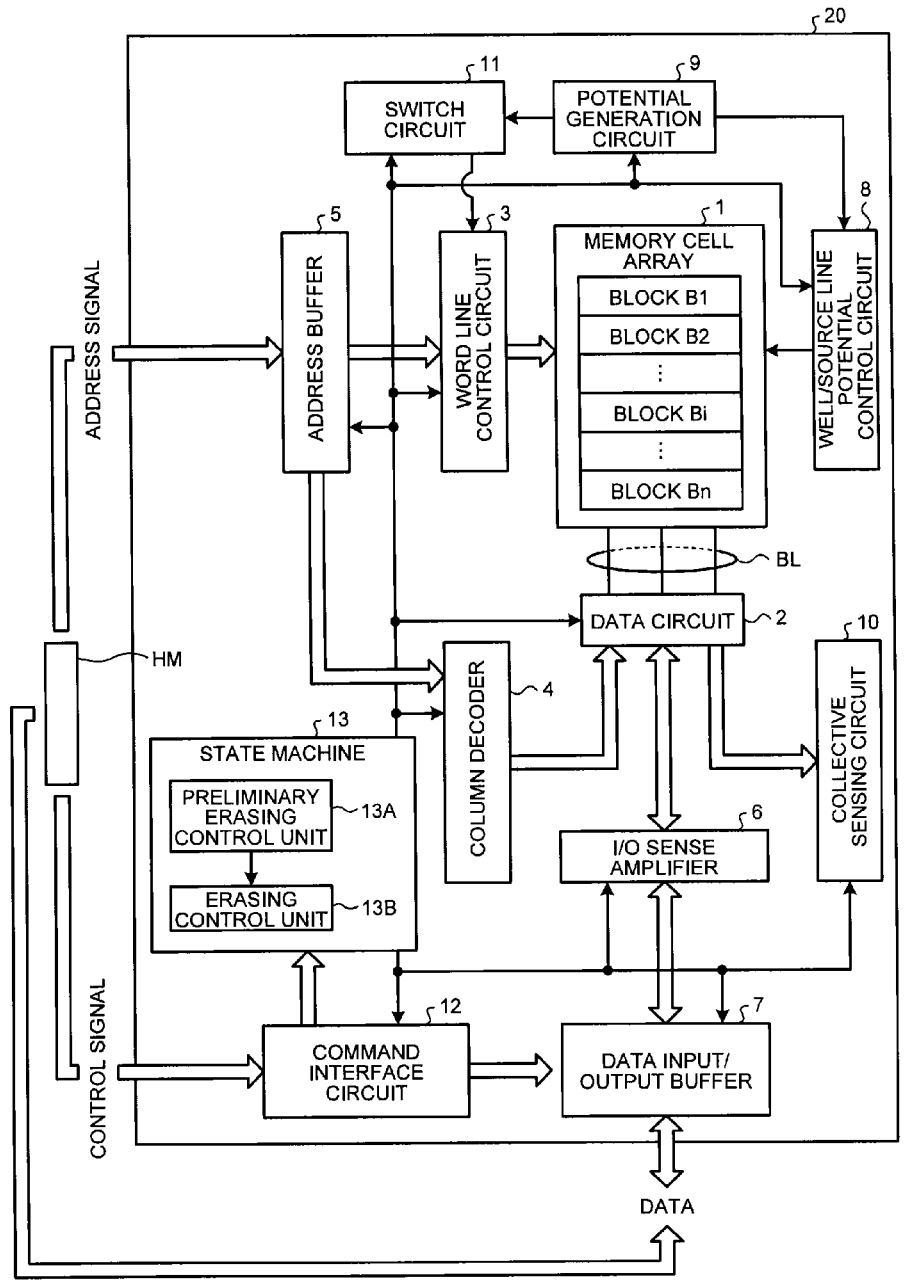
FIG. 1 is an example of a schematic block diagram illustrating a configuration of a non-volatile semiconductor storage device according to a first embodiment.

FIG. 1 is an example of a schematic block diagram illustrating a configuration of a non-volatile semiconductor storage device according to a first embodiment. In addition, in the example of FIG. 1, main components of a hexadecimal NAND cell type flash memory are illustrated.

In FIG. 1, a memory chip 20 includes a memory cell array 1, a data circuit 2, a word line control circuit 3, a column decoder 4, an address buffer 5, an I/O sense amplifier 6, a data input/output buffer 7, a well/source line potential control circuit 8, a potential generation circuit 9, a switch circuit 11, a collective sensing circuit 10, a command interface circuit 12, and a state machine 13.

The memory cell array 1 includes n blocks B1 to Bn (n is a positive integer), and each of the blocks B1 to Bn includes a NAND string. For example, the NAND string may be configured to a plurality of memory cells which are connected to each other in series and two select gates, each of which is connected to each of two ends of the NAND string.

The data circuit 2 includes a plurality of latches (storage circuits). The data circuit 2 temporarily stores 4-bit (hexadecimal) write data during the write period and temporarily stores 4-bit (hexadecimal) read data during the read period. Therefore, at least six latches are installed with respect to one bit line BL which is connected to a selected memory cell which is to be an object of read/write operation. Among the six latches, one latch stores logically low page data, and another latch stores logically high page data.

The word line control circuit 3 includes a row address decoder and a word line driver. The word line control circuit 3 controls potentials of a plurality of word lines in the memory cell array 1 based on an operation mode (write, erase, read, or the like) and an address indicated by a row address signal.

The column decoder 4 selects a column of the memory cell array 1 based on a column address signal. During the programming period, the write data is input to the storage circuit of the data circuit 2 belonging to the selected column through the data input/output buffer 7 and the I/O sense amplifier 6. In addition, during the read period, the read data is temporarily stored in the storage circuit of the data circuit 2 belonging to the selected column, and after that, the read data is output to an external portion of the memory chip 20 through the I/O sense amplifier 6 and the data input/output buffer 7.

Among the address signals, a row address signal is input to the word line control circuit 3 through the address buffer 5. A column address signal is input to the column decoder 4 through the address buffer 5.

The well/source line potential control circuit 8 controls potentials of a plurality of well regions (for example, double well regions including an n well and a p well) corresponding to the blocks B1 to Bn and a potential of a source line according to the operation mode (write, erase, read, or the like).

For example, the potential generation circuit 9 generates a program voltage Vpp (for example, about 20 V), a transfer potential Vpass (for example, about 10 V), or the like during the write period. The switch circuit 11 distributes the program potential Vpp and the transfer potential Vpass to a plurality of word lines in one or two or more selected blocks which are selected from the blocks B1 to Bn.

In addition, for example, the potential generation circuit 9 generates an erasing potential VE (for example, about 20 V) during the erasing period. Next, the erasing potential VE is applied to one or two or more well regions (both of an n well and a p well) corresponding to one or two or more selected blocks which are selected from the blocks B1 to Bn.

The collective sensing circuit 10 verifies whether or not predetermined data is accurately written in the memory cell during the programming period and verifies whether or not data of the memory cell is completely erased during the erasing period.

The command interface circuit 12 determines based on a control signal generated by a chip (for example, a host microcomputer, or a memory controller HM) different from the memory chip 20 whether or not data input to the data input/output buffer 7 is command data supplied from the host microcomputer. In the case where the data input to the data input/output buffer 7 is the command data, the command interface circuit 12 transmits the command data to the state machine 13.

The state machine 13 determines the operation mode (write, read, erase, or the like) of the NAND flash memory based on the command data and controls overall operations of the NAND flash memory, more specifically, operations of the data circuit 2, the word line control circuit 3, the column decoder 4, the address buffer 5, the I/O sense amplifier 6, the data input/output buffer 7, the well/source line potential control circuit 8, the potential generation circuit 9, the switch circuit 11, and the collective sensing circuit 10 according to the operation mode.

Herein, the state machine 13 includes a preliminary erasing control unit 13A and an erasing control unit 13B as configurations for erasing control. The preliminary erasing control unit 13A can preliminarily erase the memory cell by applying a voltage higher than that of the erasing period to a control gate electrode of the memory cell and by applying the preliminary erasing voltage VPE to the well side of the memory cell before the erasing. At this time, the preliminary erasing control unit 13A can control the voltage of the control gate electrode and the preliminary erasing voltage VPE so that a potential difference between the control gate electrode and the well is increased as the applied time elapses. The erasing control unit 13B can erase the memory cell in units of the blocks B1 to Bn by applying a constant erasing voltage VE to the well side of the memory cell.

Figure 2:
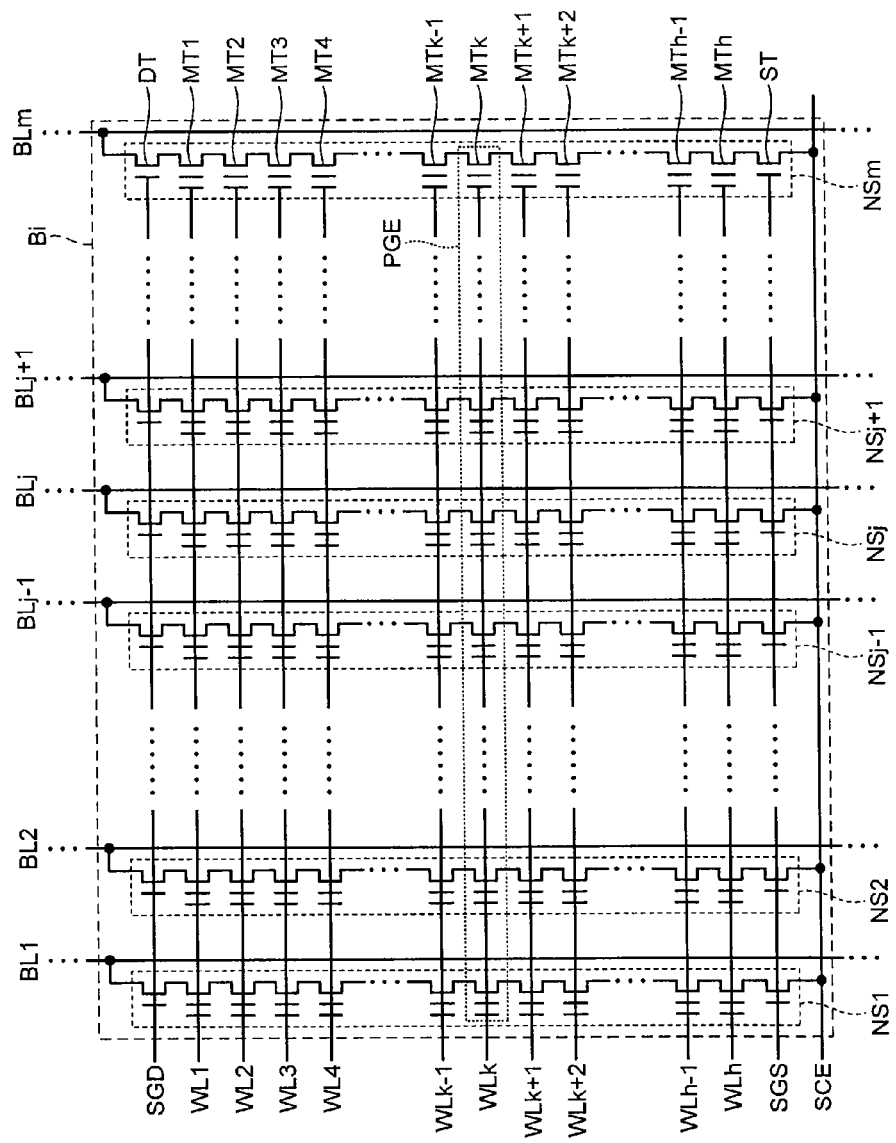
FIG. 2 is an example of a schematic circuit diagram illustrating a configuration of blocks of the non-volatile semiconductor storage device illustrated in FIG. 1.

FIG. 2 is an example of a schematic circuit diagram illustrating a configuration of blocks of the non-volatile semiconductor storage device illustrated in FIG. 1.

In FIG. 2, the block Bi (i is an integer of $1 \leq I \leq n$) includes h word lines WL1 to WLh (h is a positive integer), select gate lines SGD and SGS, and a source line SCE. In addition, m bit lines BL1 to BLm (m is a positive integer) are commonly arranged to the blocks B1 to Bn.

In addition, in the block Bi, m NAND strings NS1 to NSm are installed in the row direction, and the NAND strings NS1 to NSm are connected to the bit lines BL1 to BLm, respectively.

Herein, each of the NAND strings NS1 to NSm includes cell transistors MT1 to MTh and select transistors DT and ST. In addition, one memory cell of the memory cell array 1 may include one cell transistor MTk (k is an integer of $1 \leq k \leq h$). In addition, a charge storage region for storing charges and a control gate electrode for controlling charge storage may be installed in each of the cell transistors MT1 to MTh. The cell transistors MT1 to MTh are connected to each other in series. In addition, the select transistor DT is connected in series to the first-stage cell transistor MT1, and the select transistor ST is connected in series to the last-stage cell transistor MTh, so that the NAND string NSj (j is an integer of $1 \leq j \leq m$) is configured.

In addition, in the NAND strings NS1 to NSm, the word lines WL1 to WLh are connected to the control gate electrodes of the cell transistors MT1 to MTh, respectively. In addition, the one end of the NAND string NSj is connected to the bit line BLj through the select transistor DT, and the other end of the NAND string NSj is connected to the source line SCE through the select transistor ST.

In addition, with respect to the NAND strings NS1 to NSm, in the case where 1 bit is stored in one cell transistor, one page PGE can be configured with m memory cells including the cell transistors MTk connected to the word lines WLk. In addition, in the case where p bits (p is an integer of 2 or more) are stored in one cell transistor, p pages PGE can be configured with m memory cells including the cell transistors MTk connected to the word lines WLk.

Figure 3:
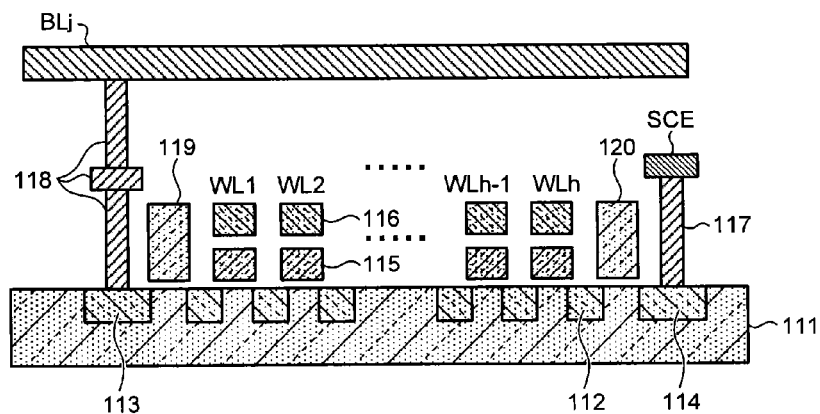
FIG. 3 is an example of schematic cross-sectional diagram illustrating a configuration of one NAND string of the non-volatile semiconductor storage device illustrated in FIG. 1.

FIG. 3 is an example of schematic cross-sectional diagram illustrating a configuration of one NAND string of the non-volatile semiconductor storage device illustrated in FIG. 1.

In FIG. 3, a charge storage layer 115 and select gate electrodes 119 and 120 are disposed on the well 111, and a control gate electrode 116 is disposed on the charge storage layer 115. In addition, the well 111 and the charge storage layer 115 can be insulated through a tunnel insulating film (not illustrated). The charge storage layer 115 and the control gate electrode 116 can be insulated through an inter-electrode insulating film (not illustrated). Herein, one charge storage layer 115 and the control gate electrode 116 formed thereon may constitute one memory cell.

In addition, impurity diffusion layers 112, 113, and 114 which are disposed between the charge storage layers 115 or between a select gate electrode 119 connected to the charge storage layer 115 and the select gate line SGD and a select gate electrode 120 connected to the select gate line SGS are formed in the well 111. In addition, for example, the well 111 may be formed as a P type, and the impurity diffusion layers 112, 113, and 114 may be formed as an N type.

In addition, the impurity diffusion layer 113 is connected to the bit line BLj through the connection conductor 118, and the impurity diffusion layer 114 is connected to the source line SCE through the connection conductor 117. In addition, the control gate electrode 116 of each memory cell is connected to the word lines WL1 to WLh, and the select gate electrodes 119 and 120 are connected to the select gate lines SGD and SGS, respectively.

Figure 4:
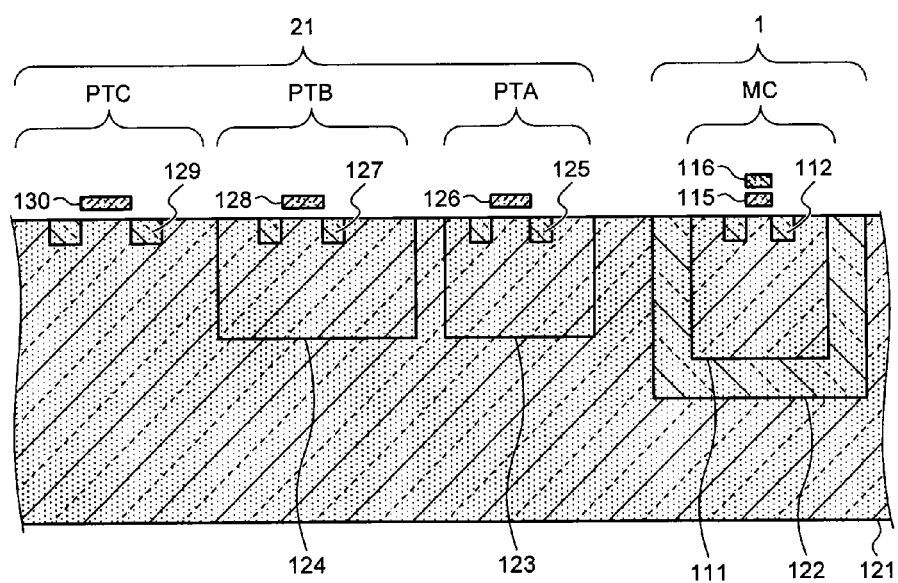
FIG. 4 is an example of schematic cross-sectional diagram illustrating a configuration of a peripheral circuit of the non-volatile semiconductor storage device illustrated in FIG. 1.

FIG. 4 is an example of schematic cross-sectional diagram illustrating a configuration of a peripheral circuit of the non-volatile semiconductor storage device illustrated in FIG. 1.

In FIG. 4, a memory cell array 1 and a peripheral circuit 21 are formed in the semiconductor substrate 121. In addition, for example, a p type silicon substrate may be used as the semiconductor substrate 121. In addition, in the memory cell array 1, a well 122 is formed in the semiconductor substrate 121, a well 111 is formed in the well 122, and an impurity diffusion layer 112 is formed in the well 111. In addition, the well 122 may be configured with an n type well, the well 111 may be configured with a p type well, and the impurity diffusion layer 112 may be configured with an n+ type diffusion layer. At this time, combined the well 122 and the well 111 may be called "cell well".

In addition, in the peripheral circuit 21, wells 123 and 124 and an impurity diffusion layer 129 are formed in the semiconductor substrate 121; an impurity diffusion layer 125 is formed in the well 123; and an impurity diffusion layer 127 is formed in the well 124. In addition, the well 123 may be configured with an n type well; the well 124 may be configured with a p type well; the impurity diffusion layer 125 may be configured with a p+ type diffusion layer; and the impurity diffusion layers 127 and 129 may be configured with a n+ type diffusion layer. At this time, the well 123 and the well 124 are dependent from the cell well.

Next, the gate electrode 126 is disposed on a channel region between the impurity diffusion layers 125, so that a peripheral transistor PTA is formed. In addition, the gate electrode 128 is disposed on a channel region between the impurity diffusion layers 127, so that a peripheral transistor PTB is formed. In addition, the gate electrode 130 is disposed on the semiconductor substrate 121 between the impurity diffusion layers 129, so that a peripheral transistor PTC is formed. The thickness of the gate insulating film of the peripheral transistor PCT can be set to be larger than the thickness of the gate insulating film of the peripheral transistors PTA and PTB. The peripheral transistor PTC can be used as a high-voltage-resistance transistor. For example, the peripheral transistor PTC can be used as a transfer transistor which transfers a high potential to the word line WL.

Next, in FIGS. 2 and 3, during the write operation, the program voltage Vpp (for example, 20 V) is applied to the selected word line WLk of the block Bi. In addition, an intermediate voltage Vpass (for example, 10 V) which is sufficient to turn on the cell transistors MT1 to MTk−1 is applied to the non-selected word lines WL1 to WLk−1 and WLk+1 to WLh. In addition, a writing voltage (for example, 0 V) according to to-be-written data or a writing prohibition voltage (for example, 2.5 V) is applied to the selected bit line BLj of the block Bi. For example, in the case where data "0" is to be written, the selected bit line BLj is set to 0 V; and in the case where data "1" is to be written, the selected bit line BLj is set to 2.5 V. The writing prohibition voltage (for example, 2.5 V) is applied to the non-selected bit lines BL1 to BLj−1 and BLj+1 to BLm.

In addition, in the relation with respect to the bit line voltage, in the case where the threshold value of the cell transistor MTk is to be increased, the voltage of turning on the select transistor DT is applied to the select gate line SGD; and in the case where the threshold value of the cell transistor MTk is not to be increased, the voltage, for example, 2.5 V of turning off the select transistor DT is applied to the select gate line SGD. In addition, a sufficiently low voltage of turning off the select transistor ST is applied to the select gate line SGS.

Therefore, in the case where charges are to be injected into the charge storage layer 115 of the cell transistor MTk, since the select transistor DT is turned on, the voltage of 0 V applied to the bit line BLj is transferred to the NAND string NSj. The voltage of 0 V applied to the bit line BLj is transferred through the cell transistors MT1 to MTk−1 of the NAND string NSj to the drain of the cell transistor MTk, and a high voltage is applied to the control gate electrode 116 of the selected cell (selected cell transistor MT), so that the potential of the charge storage layer 115 of the selected cell is increased. Therefore, due to the tunneling effect, charges are injected from the drain of the selected cell into the charge storage layer 115, and thus, the threshold value of the cell transistor MTk is increased, so that the write operation of the selected cell is executed.

On the other hand, in the case where charges are not to be injected into the charge storage layer 115 of the cell transistor MTk, the select transistor DT is turned off by the voltage of 2.5 V applied to the bit line BLj. As a result, due to the so-called self boost, the potential of the channel of the selected cell connected to the selected word line WLk is increased. As a result, the charges are not injected from the drain of the selected cell into the charge storage layer 115. Therefore, the threshold value of the voltage of the cell transistor MTk is not increased.

During the read operation, the reading voltage (for example, 0 V) is applied to the selected word line WLk of the block Bi, and an intermediate voltage (for example, 4.5 V) which is sufficient to turn on the cell transistors MT1 to MTk−1 and MTk+1 to MTh is applied to the non-selected word lines WL1 to WLk−1 and WLk+1 to WLh. In addition, an intermediate voltage (for example, 4.5 V) which is sufficient to turn on the select transistors DT and ST is applied to the select gate lines SGD and SGS. In addition, a pre-charge voltage is applied to the bit line BLj, and 0 V is applied to the source line SCE.

At this time, in the case where the threshold value of the selected cell does not reach the read level, the electrons charged in the bit line BLj are discharged through the NAND string NSj, so that the potential of the bit line BLj is at the low level. On the other hand, in the case where the threshold value of the selected cell reaches the read level, the electrons charged in the bit line BLj are not discharged through the NAND string NSj, so that the potential of the bit line BLj is at the high level.

Next, according to the determination of whether the potential of the bit line BLj is at the low level or the high level, it is determined whether or not the threshold value of the selected cell reaches the read level, so that the data stored in the selected cell can be read.

Figure 5:
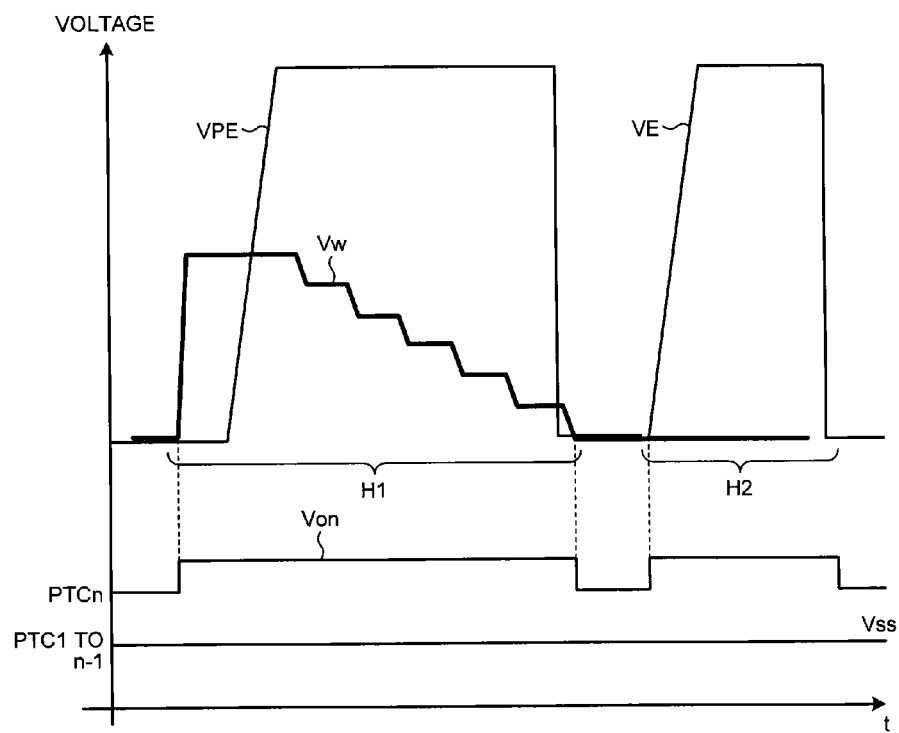
FIG. 5 is an example of a timing chart illustrating a preliminary erasing operation and an erasing operation of the non-volatile semiconductor storage device illustrated in FIG. 1.

FIG. 5 is an example of a timing chart illustrating a preliminary erasing operation and an erasing operation of the non-volatile semiconductor storage device illustrated in FIG. 1.

In FIG. 5, during the preliminary erasing period H1 (a preliminary erase operation), the word line voltage Vw which is higher than that of the erasing period H2 is applied to the word lines WL1 to WLh of the block Bi, and the well potential of the block Bi is set to a preliminary erasing voltage VPE (for example, 17 V). In addition, at this time, the word line voltage Vw can be controlled so that the word line voltage Vw is decreased from a voltage higher than 0 V to the voltage 0 V in a down-step shape. In addition, the source line SCE and the select gate lines SGD and SGS of the block Bi may be set to be in the floating state.

At this time, an intermediate voltage is applied between the well 111 and the control gate electrode 116 of the memory cell of the block Bi. Therefore, electrons stored in the charge storage layer 115 of the memory cell of the block Bi are gradually extracted to the well 111 side, so that a preliminary erasing operation of the memory cell of the block Bi is executed.

It is assumed that many electrons are stored in the charge storage layer 115 of the memory cell of the block Bi after the writing. If typical erasing of the erasing period H2 (an erase operation) when the voltage of the control gate electrode 116 becomes 0 V is performed in the state, a bias is applied to the charge storage layer 115 in which many electrons are stored, and the bias is added to the erasing voltage of the well 111, so that maximum stress is exerted on the tunnel insulating film of the memory cell at the erasing start time. Therefore, the lifetime of cell is shortened. However, in the embodiment, since the preliminary erasing operation is performed using the word line voltage Vw with a stepped shape so that a high voltage which is the same as that of the erasing period H2 is not applied between the well 111 and the control gate electrode 116 at the erasing start time, the voltage applied to the tunnel insulating film is low at the preliminary erasing start time when many electrons are stored in the charge storage layer 115, and some of the electrons stored in the charge storage layer 115 are extracted in advance during the period when the down-step of the control gate electrode 116 proceeds. Therefore, deterioration of the tunnel insulating film at the time of erasing the block Bi can be reduced.

Herein, preferably, the rising of the word line voltage Vw precedes the rising of the preliminary erasing voltage VPE, and the falling of the word line voltage Vw lags behind the falling of the preliminary erasing voltage VPE. As a result, the voltage stress added to the tunnel insulating film can be effectively reduced.

During the erasing period H2, 0 V is applied to the word lines WL1 to WLh of the block Bi, and the well potential of the block Bi is set to the erasing voltage VE (for example, 17 V). In addition, the source line SCE and the select gate lines SGD and SGS of the block Bi may be set to be in the floating state. In addition, any value which is lower than the highest word line voltage Vw of the preliminary erasing period H1 may be used as the word line voltage Vw of the erasing period H2.

During the erasing period H2, a high voltage is applied between the well 111 and the control gate electrode 116 of the memory cell of the block Bi. Therefore, electrons stored in the charge storage layer 115 of the memory cell of the block Bi are extracted to the well 111 side, so that the erasing operation of the memory cell of the block Bi is executed.

Herein, since the electrons stored in the charge storage layer 115 during the erasing period H2 are decreased in comparison with the preliminary erasing period H1, even in the case where a high voltage is applied between the well 111 and the control gate electrode 116, deterioration of the tunnel insulating film during the erasing of the block Bi can be reduced.

Figure 6:
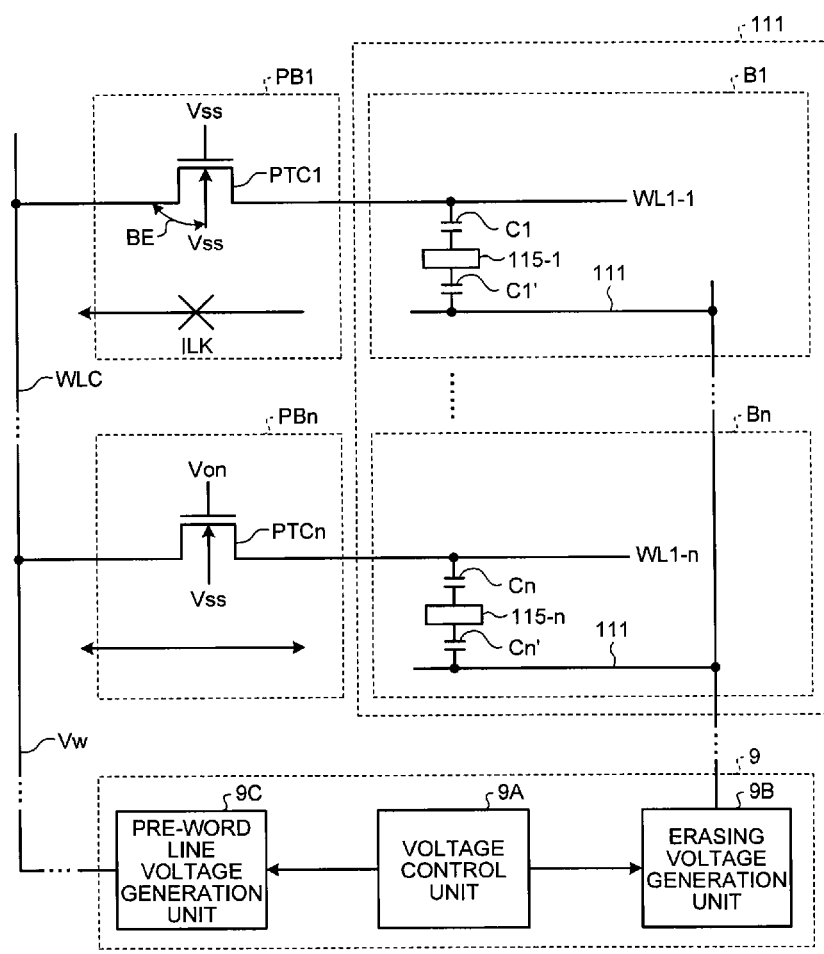
FIG. 6 is an example of a block diagram illustrating connection relation between selected blocks and non-selected blocks of the non-volatile semiconductor storage device illustrated in FIG. 1.

FIG. 6 is an example of a block diagram illustrating connection relation between selected blocks and non-selected blocks of the non-volatile semiconductor storage device illustrated in FIG. 1. In addition, in the example of FIG. 6, for the simplification of description, one charge storage layer 115 of FIG. 3 is provided to each of the blocks B1 to Bn.

In FIG. 6, the blocks B1 to Bn are arranged in the memory cell array 1 of FIG. 4, and the peripheral blocks PB1 to PBn are arranged in the peripheral circuit 21 of FIG. 4. In the blocks B1 to Bn, the word lines WL1-1 to WL1-$n$ are installed, and the charge storage layers 115-1 to 115-$n$ are installed. In addition, the charge storage layers 115-1 to 115-$n$ are connected through the floating capacitances C1 to Cn to the word lines WL1-1 to WL1-$n$ and are connected through the floating capacitances C1' to Cn' to the well 111. In the peripheral blocks PB1 to PBn, the peripheral transistors PTC1 to PTCn are arranged. The peripheral transistors PTC1 to PTCn are transfer transistors and are formed by using the structure of the peripheral transistor PTC of FIG. 4. Herein, the word lines WL1-1 to WL1-$n$ are, for example, the word line WL1 of FIG. 2 and are connected through the peripheral transistors PTC1 to PTCn in the blocks PB1 to PBn to the common word line node WLC.

The potential generation circuit 9 is configured to include a voltage control unit 9A, an erasing voltage generation unit 9B, and a pre-word line voltage generation unit 9C. The erasing voltage generation unit 9B can generates the preliminary erasing voltage VPE and the erasing voltage VE illustrated in FIG. 5. The pre-word line voltage generation unit 9C can generate the word line voltage Vw illustrated in FIG. 5. The voltage control unit 9A can control voltage generation timings of the erasing voltage generation unit 9B and the pre-word line voltage generation unit 9C.

In addition, the erasing voltage generation unit 9B is connected to the well 111. In addition, the pre-word line voltage generation unit 9C is connected through the peripheral transistors PTC1 to PTCn to the word lines WL1-1 to WL1-$n$.

Next, during the preliminary erasing period H1 illustrated in FIG. 5, the block Bn is to be selected in the state where the block B1 is non-selected, and the preliminary erasing of the block Bn is to be performed. At this time, the preliminary erasing voltage VPE generated by the erasing voltage generation unit 9B is applied to the well 111. In addition, the well voltages of the peripheral transistors PTC1 and PTCn and the gate voltage of the peripheral transistor PTC1 are set to a reference voltage Vss (for example, 0 V), and the gate voltage of the peripheral transistor PTCn is set to the ON voltage Von which is sufficient to turn on the peripheral transistor PTCn. In addition, the wells (the semiconductor substrate 121) of the peripheral transistors PTC1 to PCTn are applied with Vss by the voltage control unit 9A.

Therefore, the word line voltage Vw generated by the pre-word line voltage generation unit 9C is applied through the peripheral transistor PTCn to the word line BWn. As a result, an intermediate voltage is applied between the word line BWn of the block Bn and the well 111, and electrons stored in the charge storage layer FGn of the block Bn are gradually extracted to the well 111 side, so that the preliminary erasing operation of the memory cell of the block Bn is executed.

At this time, in the non-selected block B1, since the peripheral transistors PTC1 to PTCn−1 are turned off, the word lines WL1-1 to WL1-$n$ are in the floating state. As a result, in the case where the word line voltage Vw is low, a high voltage is applied to the well 111 side, so that the potential of the word line WL1 is increased due to the capacitance coupling of the floating capacitances C1 and C1'. Therefore, a high voltage is applied between the source and the drain of each of the peripheral transistors PTC1 to PTCn−1, and an off leak current ILK flows through the peripheral transistors PTC1 to PTCn−1. Accordingly, the electrons stored in the charge storage layer FG1 of the non-selected block B1 is extracted to the well 111 side, so that a mistake in the erasing occurs.

In the embodiment, in the preliminary erasing period H1 of FIG. 5, although the word line voltage Vw is transitioned in a down-step shape, the word line voltage Vw is increased up to an intermediate voltage in order to reduce the stress to the tunnel insulating film of the memory cell of the selected block Bm. On the other hand, when a high voltage is applied to the well 111 side, if the word line voltage Vw is increased, the potential of the word line node WLC is increased up to the word line voltage Vw. Therefore, the word line voltage Vw is applied to all the sources (word line node WLC) of the peripheral transistors PTC1 to PTCn. In other words, the state thereof becomes equivalent to the state where a back bias BE is applied to the wells of the peripheral transistors PTC1 to PTCn−1 which are in the off state. Therefore, the threshold value of the peripheral transistor PT1 is increased, so that an off leak current ILK can be reduced. As a result, extraction of the electrons stored in the charge storage layer FG1 of the non-selected block B1 to the well 111 side can be suppressed, so that the erasing error can be reduced.

Second Embodiment

Figure 7:
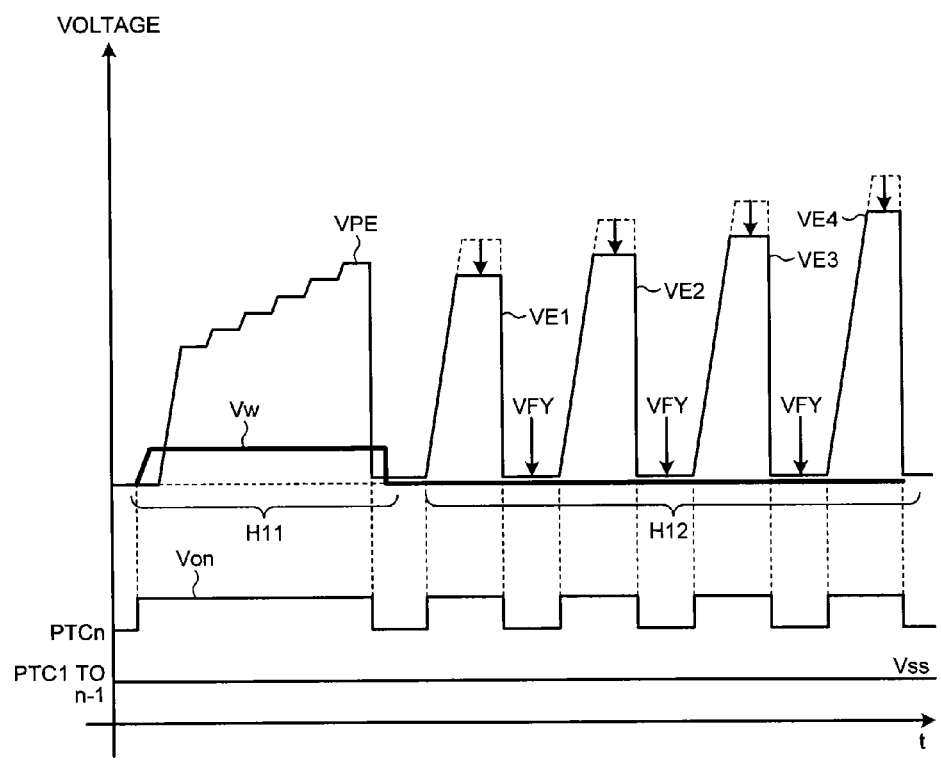
FIG. 7 is a timing chart illustrating a preliminary erasing operation and an erasing operation of a non-volatile semiconductor storage device according to a second embodiment.

FIG. 7 is a timing chart illustrating a preliminary erasing operation and an erasing operation of a non-volatile semiconductor storage device according to a second embodiment.

During the preliminary erasing period H11 (a preliminary erase operation) illustrated in FIG. 7, the word line voltage Vw which is higher than that of the erasing period H2 is applied to the word lines WL1 to WLh of the block Bi, and the well potential of the block Bi are set to the preliminary erasing voltage VPE. In addition, at this time, the word line voltage Vw can be set to a constant voltage which is higher than 0 V. In addition, the preliminary erasing voltage VPE is controlled so that the preliminary erasing voltage VPE has an up step shape which is increased from a voltage higher than 0 V. In addition, the source line SCE and the select gate lines SGD and SGS of the block Bi may be set to be in the floating state.

At this time, an intermediate voltage is applied between the well 111 and the control gate electrode 116 of the memory cell of the block Bi. Therefore, electrons stored in the charge storage layer 115 of the memory cell of the block Bi are slowly extracted to the well 111 side, so that a preliminary erasing operation of the memory cell of the block Bi is executed.

Herein, in the state where the word line voltage Vw is maintained constant, if the preliminary erasing voltage VPE is allowed to be increased from a voltage higher than 0 V in an up-step shape, at the time of starting the preliminary erasing, although many electrons are stored in the charge storage layer 115, the erasing voltage applied to the well 111 is low; and during the step proceeding period, although the erasing voltage applied to the well 111 is increased, since a small number of electrons stored in the charge storage layer 115 is extracted, so that deterioration of the tunnel insulating film during the erasing of the block Bi can be reduced.

In addition, when a high voltage is applied to the well 111 side, if the word line voltage Vw is increased, as illustrated in FIG. 6, the state thereof becomes equivalent to the state where a back bias BE is applied to the well of the peripheral transistor PT1 of the non-selected block. Therefore, the threshold value of the peripheral transistor PTC1 of the non-selected block is increased, so that an off leak current ILK can be reduced. Accordingly, extraction of the electrons stored in the charge storage layer of the non-selected block to the well 111 side can be suppressed, so that a mistake in the erasing can be reduced.

During the erasing period H12 (an erase operation), for example, 0 V is applied to the word lines WL1 to WLh of the block Bi. In addition, any value which is lower than the preliminary erasing period H11 may be used as the word line voltage Vw of the erasing period H12. In addition, the well potential of the block Bi is sequentially stepped up in the order of the erasing voltages VE1, VE2, VE3, and VE4 until a success is made in the erase verification VFY. In FIG. 7, the erasing voltage VE and the word line voltage Vw are 0V in the erase verification VFY, but voltage waveform of the erasing voltage VE and the word line voltage Vw are omitted for convenience. In addition, the source line SCE and the select gate lines SGD and SGS of the block Bi can be set to be in the floating state. In addition, in terms of high speed operation, the erasing voltage VE1 is preferably higher than a difference between the lowest value of the preliminary erasing voltage VPE and the word line voltage Vw.

At this time, a high voltage is applied between the well 111 and the control gate electrode 116 of the memory cell of the block Bi. Therefore, electrons stored in the charge storage layer 115 of the memory cell of the block Bi are extracted to the well 111 side, so that an erasing operation of the memory cell of the block Bi is executed.

Herein, since the electrons stored in the charge storage layer 115 during the erasing period H12 are decreased in comparison with the preliminary erasing period H11, even in the case where a high voltage is applied between the well 111 and the control gate electrode 116, deterioration of the tunnel insulating film during the erasing of the block Bi can be reduced.

Herein, preferably, the rising of the word line voltage Vw precedes the rising of the preliminary erasing voltage VPE, and the falling of the word line voltage Vw lags behind the falling of the preliminary erasing voltage VPE. As a result, the voltage stress added to the tunnel insulating film can be effectively reduced.

In addition, the word line voltage Vw of the erasing period H12 is set to be lower than that of the preliminary erasing period H11, so that the erasing voltages VE1, VE2, VE3, and VE4 can be decreased. Therefore, breakdown of the peripheral transistors PTC1 and PTCn can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, instead of an up step or a down step, a linear increase or decrease as time sequence may be available, or a curved increase or decrease as time sequence may be available. A plurality of erasing voltages may be added during a preliminary erasing period.

What is claimed is:

1. A non-volatile semiconductor storage device comprising:
   a memory cell array including memory cells; and
   a control unit configured to perform an erase operation by applying an erasing voltage to a well side of the memory cell and to perform a first operation before the erase operation by applying a first positive voltage to the well side of the memory cell while applying a second positive voltage, which is higher than a voltage during the erase operation, to a control gate electrode of the memory cell.

2. The non-volatile semiconductor storage device according to claim 1, wherein the control unit applies the second positive voltage in a stepped-down shape to the control gate electrode of the memory cell and applies the first positive voltage, which is constant, to the well side of the memory cell.

3. The non-volatile semiconductor storage device according to claim 1, wherein the control unit applies the second positive voltage which is a constant voltage to the control gate electrode of the memory cell and increases the first positive voltage of the well side of the memory cell in time sequence.

4. The non-volatile semiconductor storage device according to claim 3, wherein the control unit increases the first positive voltage in a stepped-up shape.

5. The non-volatile semiconductor storage device according to claim 3, wherein the erasing voltage is higher than a difference between the lowest voltage of the first positive voltage and the second positive voltage of the control gate electrode.

6. The non-volatile semiconductor storage device according to claim 5, wherein in a case of a failure in erase verification, the erasing voltage is sequentially stepped up until a success in the erase verification.

7. The non-volatile semiconductor storage device according to claim 1, wherein the control unit is configured to raise the voltage of the control gate electrode and then raise the first positive voltage of the well side; and the control unit is configured to lower the first positive voltage and then lower the voltage of the control gate electrode.

8. The non-volatile semiconductor storage device according to claim 1, wherein a NAND string is configured by connecting the memory cells in series, the memory cell array is configured so that the memory cells are arranged in units of a block, and the erase operation and the first operation are executed in units of a block.

9. The non-volatile semiconductor storage device according to claim 8, wherein the memory cell array includes:

a NAND string where the memory cells are connected to each other in series;

a first select transistor which is connected to one end of the NAND string; and a second select transistor which is connected to the other end of the NAND string.

10. The non-volatile semiconductor storage device according to claim 9, further comprising:

an erasing voltage generation unit which generates the erasing voltage, the first positive and a pre-word line voltage which is higher than the voltage applied during the erase operation; and a voltage control unit which applies the first positive voltage to the well while applying the pre-word line voltage to the control gate electrode during the first operation and applies the erasing voltage to the well during the erase operation.

11. The non-volatile semiconductor storage device according to claim 10, further comprising a transfer transistor which is disposed in each block to transfer the pre-word line voltage to word lines of a selected block.

12. The non-volatile semiconductor storage device according to claim 11, wherein the transfer transistor is arranged outside the well.

13. The non-volatile semiconductor storage device according to claim 12, further comprising word line nodes which are commonly connected to a source of the transfer transistor to be applied with the pre-word line voltage.

14. The non-volatile semiconductor storage device according to claim 13, wherein, during the first operation, the transfer transistor of a non-selected block is turned off, and the transfer transistor of a selected block is turned on.

15. The non-volatile semiconductor storage device according to claim 14, wherein, during the first operation, the transfer transistor of the non-selected block is back-biased by applying the pre-word line voltage to the word line node, so that a threshold value of the transfer transistor of the non-selected block is increased.

16. The non-volatile semiconductor storage device according to claim 15, wherein, during the first operation, the word line of the non-selected block is floated by turning off the transfer transistor of the non-selected block.

17. The non-volatile semiconductor storage device according to claim 16, wherein, when the first positive voltage is applied to the well during the first operation, a voltage of the word line of the non-selected block is increased based on capacitive coupling between the well and the word line.

18. The non-volatile semiconductor storage device according to claim 1, wherein the control unit controls the voltage of the control gate electrode and the first positive voltage so that a potential difference between the control gate electrode and the well is increased as an application time elapses.

\* \* \* \* \*